(12) United States Patent
Hergott

(10) Patent No.: US 6,567,325 B1
(45) Date of Patent: May 20, 2003

(54) APPARATUS AND METHOD FOR SYSTEM ACCESS TO TAP CONTROLLED BIST OF RANDOM ACCESS MEMORY

(75) Inventor: Michael A. Hergott, Colorado Springs, CO (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/829,373

(22) Filed: Apr. 9, 2001

(51) Int. Cl.[7] ................................................. G11C 7/00
(52) U.S. Cl. ................................. 365/201; 365/189.07
(58) Field of Search ............................. 365/201, 189.07, 365/149; 714/30, 733, 726, 727

(56) References Cited

U.S. PATENT DOCUMENTS

| | | | | |
|---|---|---|---|---|
| 5,568,437 A | * | 10/1996 | Jamal | 365/189.07 |
| 5,570,375 A | * | 10/1996 | Tsai et al. | 714/30 |
| 5,878,051 A | * | 3/1999 | Sharma et al. | 714/724 |
| 6,067,262 A | | 5/2000 | Irrinki et al. | 365/201 |

OTHER PUBLICATIONS

"IEEE Std 1149.1 (JTAG) Testability," Texas Instruments, 1997 Semiconductor Group, 1996.

* cited by examiner

Primary Examiner—Richard Elms
Assistant Examiner—Anh Phung
(74) Attorney, Agent, or Firm—Akin Gump Strauss Hauer & Feld LLP

(57) ABSTRACT

An integrated circuit having functional logic that provides system access to test access port controlled built-in-self-test logic is provided. The integrated circuit includes a test access port controller having an enable output and a status input. A built-in-self-test controller having an enable input, a status output, one or more random access memory cell controller outputs and one or more random access memory cell inputs is also provided. A functional logic interface is connected to the functional logic, the test access port controller enable output, and the built-in-self-test controller enable input, and allows a built-in self-testing sequence to be initiated from the test access port controller or the system.

20 Claims, 3 Drawing Sheets

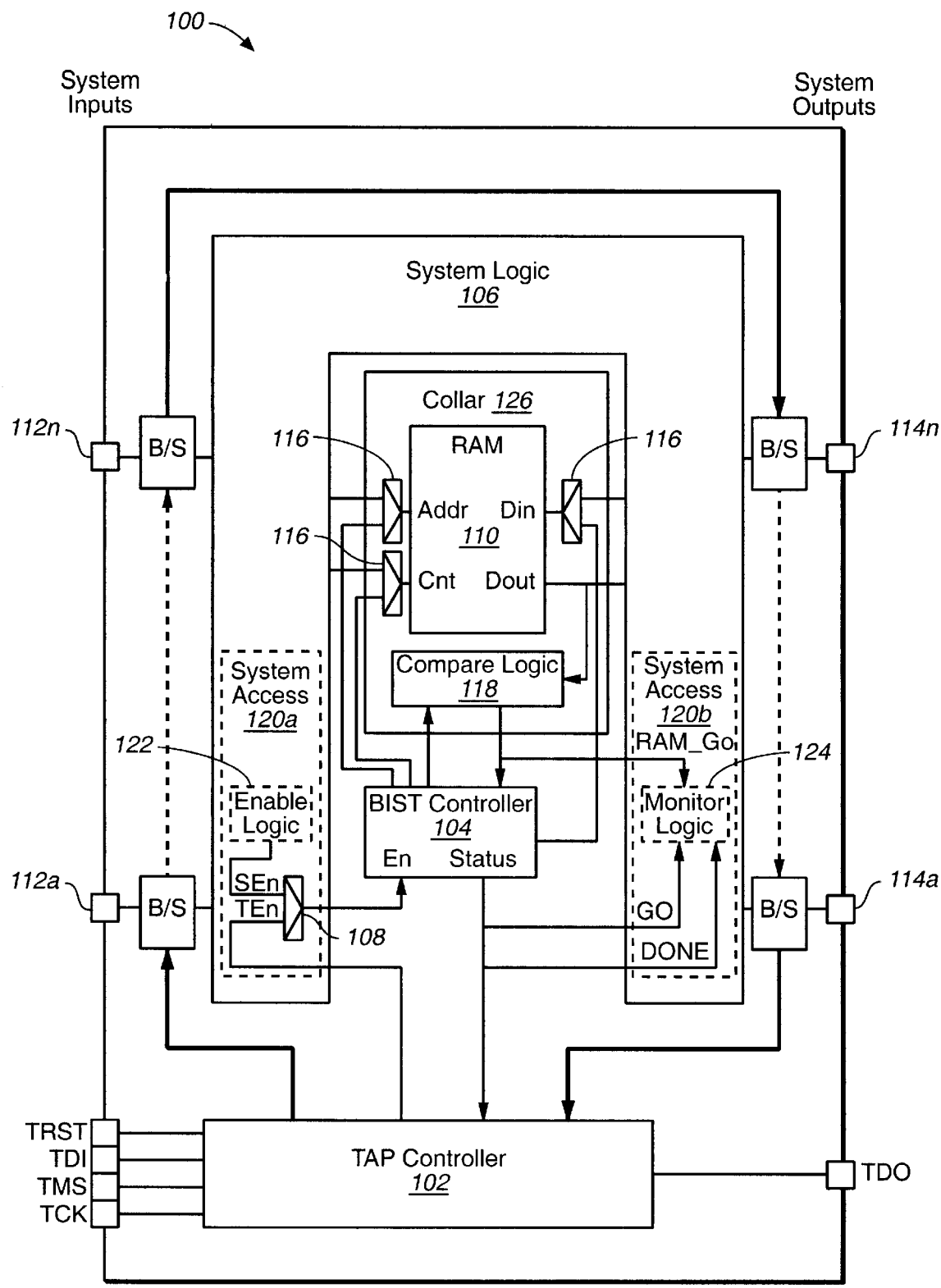
FIG._1

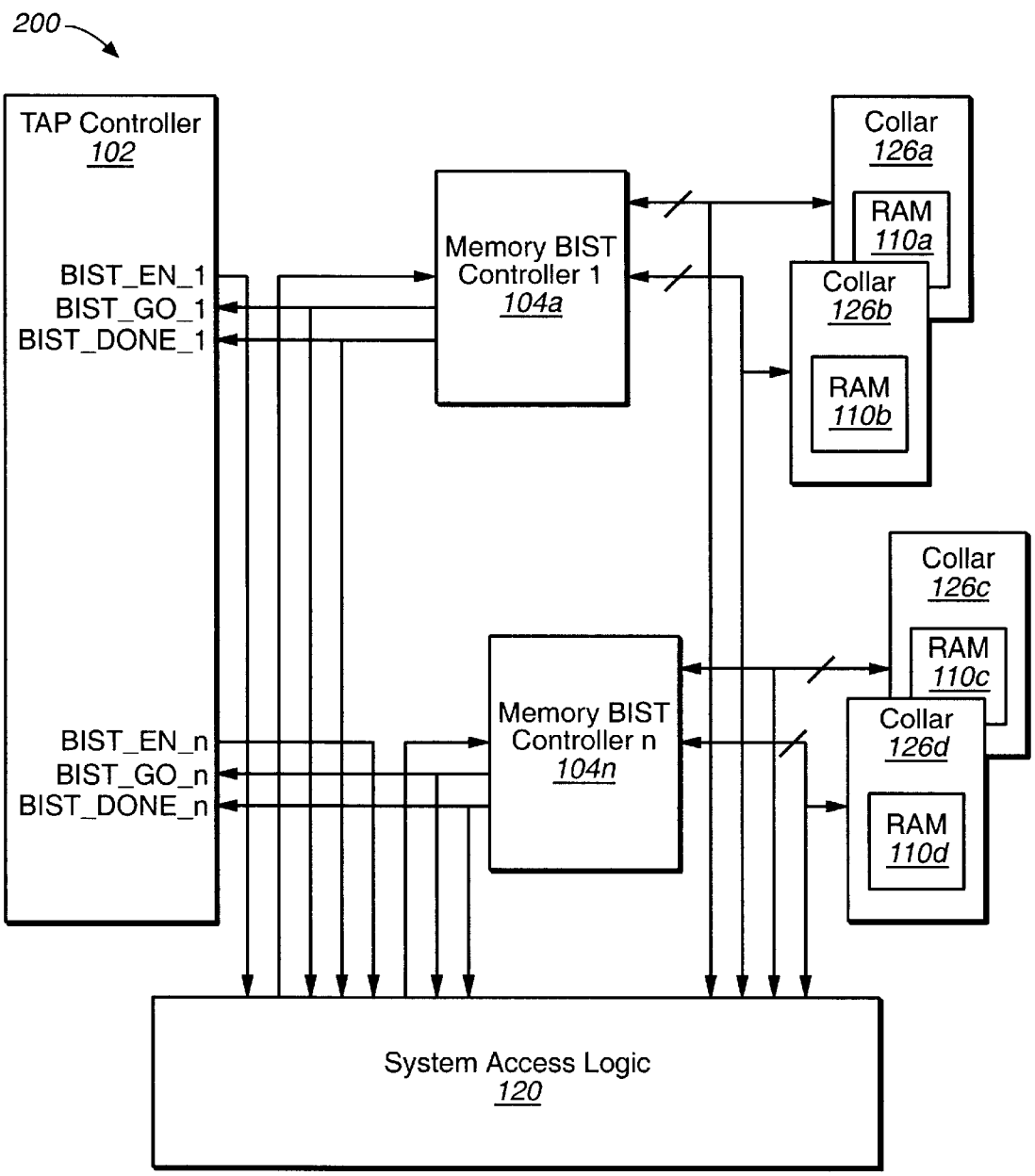
FIG._2

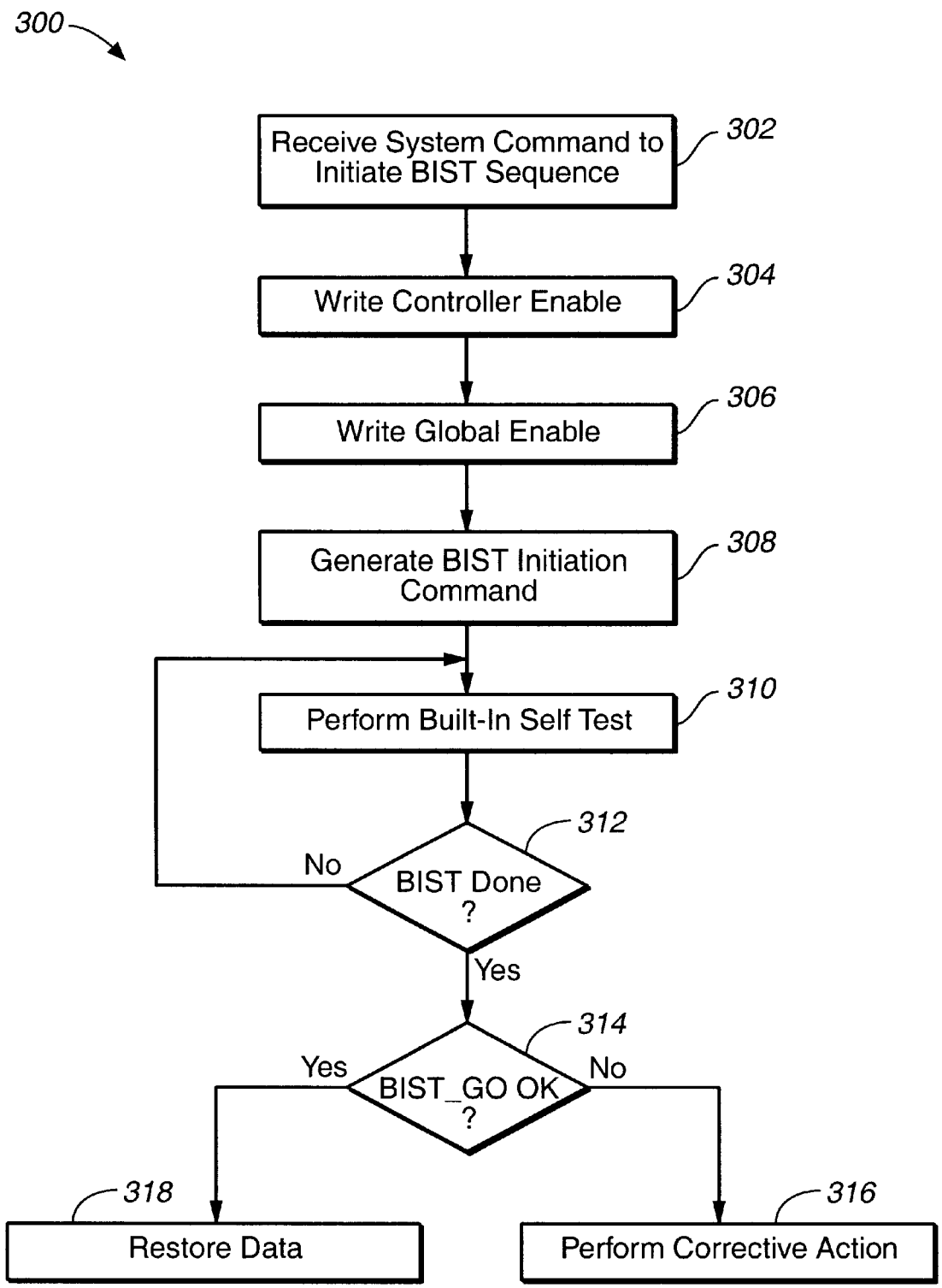
FIG._3

APPARATUS AND METHOD FOR SYSTEM ACCESS TO TAP CONTROLLED BIST OF RANDOM ACCESS MEMORY

FIELD OF THE INVENTION

The present invention relates generally to semiconductor devices, and more particularly, it relates to semiconductor devices that allow system access to built-in self test circuitry for random access memories.

BACKGROUND OF THE RELATED ART

Integrated circuits such as application specific integrated circuits typically include an IEEE standard 1149.1 test access port (TAP) controller to allow production testing of memory components of the integrated circuit, such as random access memory (RAM). In addition, such integrated circuits typically also include a built-in self test (BIST) controller, which provides control for the self testing of the RAM memory. In such systems, the TAP controller can receive production tests and board level tests signals and can then enable the BIST controller to perform the built-in self test of the RAM cells.

In addition to production testing, system testing of RAM cells is also required. However, the production test provided in accordance with IEEE standard 1149.1 typically is not compatible with system testing. Thus, it is necessary to provide redundant logic for performing BIST testing of RAM cells from a system initiated signal, and for system monitoring of the BIST status and results.

SUMMARY OF THE INVENTION

In accordance with the present invention, an apparatus and method for system access to TAP-controlled BIST of random access memory are provided that overcome known problems with providing system access to BIST.

In particular, an apparatus and method for system access to TAP-controlled BIST of random access memory are provided that allow the TAP-controlled BIST logic to be utilized for system-initiated BIST of RAM.

In accordance with an exemplary embodiment of the present invention, an integrated circuit having functional logic that provides system access to test access port controlled built-in-self-test logic is provided. The integrated circuit includes a test access port controller having an enable output and a status input. A built-in-self-test controller having an enable input, a status output, one or more random access memory cell controller outputs and one or more random access memory cell inputs is also provided. A functional logic interface is connected to the functional logic, the test access port controller enable output, and the built-in-self-test controller enable input, and allows a built-in self-testing sequence to be initiated from the test access port controller or the system.

The present invention provides many important technical advantages. One important technical advantage of the present invention is an apparatus and method for providing system access to TAP-controlled BIST that does not require additional BIST logic to be provided for system-initiated BIST of RAM. The present invention is IEEE standard 1149.1 compliant, and reduces the cost and number of logical components required to provide for system access to BIST of RAM.

Those skilled in the art will further appreciate the advantages and superior features of the invention together with other important aspects thereof on reading the detailed description that follows in conjunction with the drawings.

BRIEF DESCRIPTION OF THE SEVERAL VIEWS OF THE DRAWINGS

A better understanding of the present invention can be obtained when the following detailed description of an exemplary embodiment is considered in conjunction with the following drawings, in which:

FIG. 1 is a diagram of a system for providing system access to the TAP controlled memory BIST logic in accordance with an exemplary embodiment of the present invention;

FIG. 2 is a diagram of a system for allowing system access to built-in self testing of RAM circuits in accordance with an exemplary embodiment of the present invention; and FIG. 3 is a flow chart of a method for providing system access to a built-in self test of a RAM cell in accordance with an exemplary embodiment of the present invention.

DETAILED DESCRIPTION OF THE INVENTION

In the description that follows, like parts are marked throughout the specification and drawings with the same reference numerals, respectively. The drawing figures might not be to scale, and certain components can be shown in generalized or schematic form and identified by commercial designations in the interest of clarity and conciseness.

FIG. 1 is a diagram of a system 100 for providing system access to the TAP controlled memory BIST logic in accordance with an exemplary embodiment of the present invention. System 100 allows a system command to be used to initiate BIST testing of RAM in accordance with IEEE standard 1149.1.

System 100 includes TAP controller 102, which is an IEEE standard 1149.1 compliant test access port controller. TAP controller 102 includes a test reset input, a test data input, a test mode select input, and a test clock input, and a test data output. These inputs and outputs are used to control BIST testing of RAM in production and for board-level testing. TAP controller 102 also includes a Boundary-Scan (B/S) output and input, a BIST enable output, and one or more BIST status inputs.

System 100 also includes BIST controller 104, which includes suitable built-in self test control logic. BIST controller 104 includes a BIST enable input, a plurality of outputs for initiating and controlling the built-in self test of the RAM cells, a plurality of inputs for receiving the results from each RAM cell, and a plurality of status outputs for generating data signals indicative of the results of the RAM testing. Two or more BIST controllers 104 can be provided for testing of RAM cells.

System 100 also includes system logic 106, which can be suitable functional logic for an integrated circuit that requires access to RAM cells. For example, system logic 106 can include application specific integrated circuit (ASIC) logic that is designed for specific applications, general purpose logic, or other suitable circuits and systems. System logic 106 is coupled to the Boundary-Scan peripheral component interconnect (PCI-X) interface, system inputs 112a through 112n, and system outputs 114a through 114n, respectively.

System logic 106 further includes system access logic 120a and 120b, which are used to provide system access to the BIST controller 104. The system access logic 120a and 120*b* includes two basic functions: providing a BIST_EN signal to BIST controller 104 and monitoring the BIST_GO and BIST_DONE signals from BIST controller 104 to determine pass/fail status. System access logic 120*a* includes enable logic 122, which provides a system-derived BIST enable signal to multiplexer 108. System access logic 120*b* includes monitor logic 124, which receives the RAM_Go signal from compare logic 118 after completion of the BIST testing, and the BIST_GO and BIST_DONE signals from BIST controller 104.

The BIST_GO signal from BIST controller 104 is the logical AND of all GO signals from each RAM under that BIST controller 104. As such, it is a composite pass/fail result from all comparators under that BIST controller 104. The comparators can be implemented in collar 126, BIST controller 104, or other suitable locations. System logic 106 is also coupled to RAM cell 110 through a plurality of output leads that are coupled to multiplexers 116 of memory collar 126. System logic 106 receives data output from the data out signals of RAM cell 10 through one of multiplexers 116, and compare logic 118 RAM_GO status output, and BIST controller 104 BIST_GO and BIST_DONE status outputs, and provides this data to system outputs 114*a* through 114*n* through the Boundary-Scan PCI-X interface.

RAM cell 10 has one or more control inputs, one or more address inputs, one or more data inputs, and one or more data outputs. RAM cell 110 is accessed through a memory collar 126, which can be contained within the RAM cell, within BIST controller 104, or in other suitable configurations. RAM cell 110 is exemplary, and typically a plurality of RAM cells will be used in conjunction with a TAP controller 102.

In operation, system 100 provides system access to BIST controller 104, which can be provided for chip level production testing and board level testing. System 100 provides a multiplexer 108 that receives a BIST enable signal from system logic 106, which is derived from system inputs 112*a* through 112*n*. The initiation and monitoring of the BIST status and results is therefore enabled through system inputs 112*a* through 112*n* and system outputs 114*a* through 114*n* by system 100. Multiplexer 108 prevents interruption of a TAP controller 102 initiated BIST, such as by locking out a system initiated BIST for the duration of the BIST sequence after it is initiated by TAP controller 102. In this manner, system 100 provides IEEE standard 1149.1 compliant system access to BIST controller 104.

Likewise, system logic 106 can be configured to control and facilitate BIST sequencing for use with system enabled testing. For example, the contents of RAM cell 110 will be overwritten when BIST controller 104 performs the BIST sequence, which can comprise writing to RAM memory locations with data, reading the data stored in those RAM memory locations, and then performing a compare, such as with compare logic 118 to determine whether the data stored in the RAM matches the data that was retrieved from the RAM. Thus, system logic 106 can be used to store the contents of RAM cells 110, such as by completing all processes prior to performing BIST system enable BIST testing, by storing the data in external RAM, or by other suitable procedures.

Likewise, system configuration data may need to be rewritten to the RAM cells 110 after a completion of the BIST sequence. Thus, system logic 106 can be used to store the system configuration data from the RAM before initiation of the BIST sequence and to store the system configuration data to the RAM after completion of the BIST sequence.

FIG. 2 is a diagram of a system 200 for allowing system access to built-in self testing of RAM circuits in accordance with an exemplary embodiment of the present invention. System 200 provides additional detail showing the connection of TAP controller 102, BIST controllers 104*a* through 104*n*, and system access logic 120.

TAP controller 102 includes a plurality of BIST enable signals, shown as BIST_EN_1 and BIST_EN_n. The outputs of the BIST enable signals from TAP controller 102 are coupled to BIST controllers 104*a* and 104*n*, and system access logic 120. Likewise, system access logic 120 is coupled to the BIST_GO_1 and BIST_GO_n inputs of BIST controllers 104*a* and 104*n*, respectively.

BIST controllers 104*a* and 104*n* are coupled to collars 126*a* through 126*d*, which provide access to RAM cells 110*a* through 110*d*, respectively. Each BIST controller performs built-in self testing of one or more RAM cells in each collar 126, and receives test results from each corresponding RAM memory cell. BIST controllers 104*a* and 104*n* then output BIST_DONE_1 and BIST_DONE_n signals, respectively, to TAP controller 102 and system access logic 120.

In operation, system 200 allows system logic 106 to provide a BIST enable signal to one or more BIST controllers so as to allow system access and monitoring of the BIST status signals. System 200 provides for IEEE standard 1149.1 compatibility with such system access to BIST testing.

FIG. 3 is a flow chart of a method 300 for providing system access to a built-in self test of a RAM cell in accordance with an exemplary embodiment of the present invention. Method 300 begins at 302 where system access of memory BIST is executed, such as by executing a command to perform a BIST subroutine and return predetermined BIST results data. The method then proceeds to 304.

At 304, system access CONTROLLER ENABLE data is written to a configuration register of each BIST controller. The system access CONTROLLER ENABLE data indicates that the BIST controller has received a system-initiated BIST command, but the BIST controller does not begin testing of RAM cells until a global command has also been generated for all BIST controllers. The method then proceeds to 306.

At 306, system access GLOBAL ENABLE data is written to a configuration register of each BIST controller. The global enable data can be generated after status data is received from each BIST controller, such as indicating that the BIST controller is ready to begin BIST testing, that data has been backed up, that TAP controller-initiated BIST testing is not in progress, or for other suitable purposes. The method then proceeds to 308.

At 308, the system receives a command to initiate the BIST sequence, such as by generating a signal derived from the CONTROLLER ENABLE and GLOBAL ENABLE data of the configuration registers of the BIST controllers. The method then proceeds to 310.

At 310, the built-in self test is performed. The built-in self test can include storing predetermined data to one or more memory locations of each RAM cell, reading the data stored the one or more memory locations, and then performing a compare of the data that was stored and the data that was read, to determine whether the data is identical. If the data is not identical, then one or more memory location is misoperating, and the BIST_GO data output will indicate the test failure. Other suitable built-in self tests can likewise be performed. The method then proceeds to 312.

At 312, it is determined whether a BIST_DONE signal has been asserted from each BIST controller. If the BIST_DONE signal has not been asserted, then the method returns to 310. Otherwise, the method proceeds to 314.

At 314, it is determined whether the BIST_GO status registers indicate that a failed RAM cell exists. If a failed RAM cell exists, the method proceeds to 316 and failed RAM cell status data is generated, such as identification data of the failed RAM cell. The system can also reconfigure itself to continue operating with the failed RAM cell, notify a user or operator of the failed RAM cell, or perform other suitable functions. If a failed RAM cell does not exist, the method proceeds to 318.

At 318, back-up data is restored to the RAM cells, such as by retrieving the data from one or more external memory locations, determining system status data, configuration data or other suitable data and storing the data, or performing other suitable functions.

In operation, method 300 provides for system access to BIST enablement and monitoring of built-in self testing of RAM circuits and memory cells in accordance with an exemplary embodiment of the present invention. Method 300 prevents the system initiation of BIST testing when a TAP-initiated BIST is in progress, and also allows data stored in the RAM to be saved prior to initiation of the BIST sequence.

In view of the above detailed description of the present invention and associated drawings, other modifications and variations will now become apparent to those skilled in the art. It should also be apparent that such other modifications and variations may be effected without departing from the spirit and scope of the present invention.

I claim:

1. An integrated circuit having functional logic that provides system access to test access port controlled built-in-self-test logic, the integrated circuit comprising:
    a test access port controller having an enable output and a status input;
    a built-in-self-test controller having an enable input, a status output, one or more random access memory cell controller outputs and one or more random access memory cell inputs;
    a functional logic interface coupled to the functional logic, the test access port controller enable output, and the built-in-self-test controller enable input;
    one or more first memory collars, each coupled to the functional logic and to one of the random access memory cell controller outputs;
    one or more second memory collars, each coupled to the functional logic and to one of the random access memory cell controller inputs; and
    one or more random access memory cells, each coupled to one of the first memory collars and the second memory collars.

2. The integrated circuit of claim 1 wherein the functional logic interface is a multiplexer.

3. The integrated circuit of claim 2 wherein each of the memory collars further comprises a comparator.

4. The integrated circuit of claim 2 wherein the built-in-self-test controller further comprises a comparator coupled to each memory collar.

5. An integrated circuit having functional logic that provides system access to test access port controlled built-in-self-test logic, the integrated circuit comprising:
    a test access port controller having an enable output and a status input;
    a built-in-self-test controller having an enable input, a status output, one or more random access memory cell controller outputs and one or more random access memory cell inputs;
    a functional logic interface coupled to the functional logic, the test access port controller enable output, and the built-in-self-test controller enable input;
    one or more PCI-X interface inputs coupled to the test access port controller and the functional logic; and
    one or more PCI-X interface outputs coupled to the test access port controller and the functional logic.

6. A method for testing integrated circuits having functional logic, one or more built-in-self-test controller circuits, and test access port circuitry, wherein each built-in-self-test controller circuit is coupled to one or more random access memory circuits, the method comprising:
    receiving a system command to initiate a built-in-self-test sequence;
    applying a built-in-self-test enable signal from the functional logic to the built-in-self test circuitry in response to the system command;
    performing the built-in-self-test sequence; and
    wherein receiving the system command to initiate the built-in-self-test sequence further comprises receiving the system command through a PCI-X interface.

7. The method of claim 6 further comprising writing system configuration data to the one or more random access memory circuits after completion of the built-in-self-test sequence.

8. A method for testing integrated circuits having functional logic, one or more built-in-self-test controller circuits, and test access port circuitry, wherein each built-in-self-test controller circuit is coupled to one or more random access memory circuits, the method comprising:
    receiving a system command to initiate a built-in-self-test sequence;
    applying a built-in-self-test enable signal from the functional logic to the built-in-self test circuitry in response to the system command;
    performing the built-in-self-test sequence; and
    monitoring results of the built-in-self-test sequence through the functional logic.

9. The method of claim 8 further comprising receiving a BIST_GO status signal for each random access memory circuit.

10. The method of claim 9 further comprising receiving a BIST_DONE status signal from each built-in-self-test controller circuit.

11. The method of claim 8 further comprising receiving a BIST_DONE status signal from each built-in-self-test controller circuit.

12. A method for testing integrated circuits having functional logic, one or more built-in-self-test controller circuits, and test access port circuitry, wherein each built-in-self-test controller circuit is coupled to one or more random access memory circuits, the method comprising:
    receiving a system command to initiate a built-in-self-test sequence;
    applying a built-in-self-test enable signal from the functional logic to the built-in-self test circuitry in response to the system command;
    performing the built-in-self-test sequence; and
    wherein receiving the system command to initiate the built-in-self-test sequence further comprises writing the system command to a BIST_EN configuration register for each of the built-in-self-test controller circuits.

13. A method for testing integrated circuits having functional logic, one or more built-in-self-test controller circuits, and test access port circuitry, wherein each built-in-self-test controller circuit is coupled to one or more random access memory circuits, the method comprising:
- receiving a system command to initiate a built-in-self-test sequence;
- applying a built-in-self-test enable signal from the functional logic to the built-in-self test circuitry in response to the system command;
- performing the built-in-self-test sequence; and
- receiving a BIST_DONE status signal from each built-in-self-test controller circuit.

14. A method for testing integrated circuits having functional logic, one or more built-in-self-test controller circuits, and test access port circuitry, wherein each built-in-self-test controller circuit is coupled to one or more random access memory circuits, the method comprising:
- receiving a system command to initiate a built-in-self-test sequence;
- applying a built-in-self-test enable signal from the functional logic to the built-in-self test circuitry in response to the system command;
- performing the built-in-self-test sequence; and
- receiving a BIST_GO status signal for each random access memory circuit.

15. A method for testing integrated circuits having functional logic, one or more built-in-self-test controller circuits, and test access port circuitry, wherein each built-in-self-test controller circuit is coupled to one or more random access memory circuits, the method comprising:
- receiving a system command to initiate a built-in-self-test sequence;
- applying a built-in-self-test enable signal from the functional logic to the built-in-self test circuitry in response to the system command;
- performing the built-in-self-test sequence; and
- wherein receiving the system command to initiate the built-in-self-test sequence further comprises blocking the system command to initiate the built-in-self-test sequence if the test access port circuitry has initiated the built-in-self-test sequence.

16. A method for testing integrated circuits having functional logic, one or more built-in-self-test controller circuits, and test access port circuitry, wherein each built-in-self-test controller circuit is coupled to one or more random access memory circuits, the method comprising:
- receiving a system command to initiate a built-in-self-test sequence;
- applying a built-in-self-test enable signal from the functional logic to the built-in-self test circuitry in response to the system command;
- performing the built-in-self-test sequence;
- storing data from the one or more random access memory circuits in a data memory prior to performing the built-in-self-test sequence; and
- returning the data from the data memory to the one or more random access memory circuits after completion of the built-in-self-test sequence.

17. System access logic for an integrated circuit that provides system access to test access port controlled built-in-self-test logic, the system access logic comprising:
- a system enable input receiving a system BIST enable signal;
- a TAP controller input receiving a TAP BIST enable signal;
- a BIST controller output generating a BIST enable output signal as a function of the system BIST enable signal and the TAP BIST enable signal; and
- monitor logic receiving a RAM_Go signal, a BIST_GO signal and a BIST_DONE signal and providing BIST status data to system logic.

18. The system access logic of claim 17 further comprising enable logic receiving the system BIST enable signal and generating a system enable high signal.

19. The system access logic of claim 17 further comprising a multiplexer receiving the system BIST enable signal and the TAP BIST enable signal and generating the BIST enable output signal.

20. The system access logic of claim 17 further comprising a compare logic input and a BIST controller input.

* * * * *